United States Patent
Chung et al.

(10) Patent No.: US 6,361,929 B1
(45) Date of Patent: Mar. 26, 2002

(54) METHOD OF REMOVING A PHOTO-RESIST LAYER ON A SEMICONDUCTOR WAFER

(75) Inventors: Hsein-Ta Chung, Tai-Chung; Yi-Yu Hsu, Taipei; Tong-Yu Chen, Hsin-Chu; Tri-Rung Yew, Hsin-Chu Hsein, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/373,755

(22) Filed: Aug. 13, 1999

(51) Int. Cl.$^7$ .............................. G03F 7/36; G03F 7/38
(52) U.S. Cl. ...................... 430/329; 438/706; 438/710; 438/745; 438/749
(58) Field of Search .................... 430/329; 438/706, 438/710, 745, 749

(56) References Cited

U.S. PATENT DOCUMENTS 5,993,916 A * 11/1999 Zhao et al. .................. 427/535
6,060,397 A * 5/2000 Seamons et al. ............ 438/694

* cited by examiner

*Primary Examiner*—Hoa Van Le
(74) *Attorney, Agent, or Firm*—Winston Hsu

(57) ABSTRACT

The present invention relates to a method of removing a photo-resist layer from a semiconductor wafer. The semiconductor wafer comprises an inter-metal dielectric layer (IMD), and a photo-resist layer positioned on the IMD. The method comprises performing a dry cleaning process by injecting a nitrogen-containing gas into an oxygen-free environment and utilizing a plasma reaction to remove most of the photo-resist layer, and performing a wet cleaning process to completely remove the photo-resist layer.

9 Claims, 2 Drawing Sheets

METHOD OF REMOVING A PHOTO-RESIST LAYER ON A SEMICONDUCTOR WAFER

BACKGROUND OF THE INVENTION

1. Field of the Invention

The present invention relates to a method of removing a photo-resist layer on a semiconductor wafer, and more particularly, to a method of removing a photo-resist layer in an environment without oxygen.

2. Description of the Prior Art

In the dual-damascene process of semiconductor, the metallic wire is formed within the inter-metal dielectrics (IMD) to connect the transistor and other devices on the semiconductor wafer. The formation of the metallic wire comprises forming a photo-resist layer on the IMD of the semiconductor wafer by using the photolithography process to define a recess or a contact hole. Then, the photo-resist layer is removed, and a metallic layer is formed in the recess or the contact hole to function as a metallic wire. The prior art method of removing the photo-resist layer destroys the profile of the recess or the contact hole and affects the subsequent process. Therefor, the method of removing the photo-resist layer must be improved in order to keep the quality of the dual-damascene process.

Please refer to FIG. 1. FIG. 1 is a schematic diagram of a prior art method of forming a contact hole 22 on a semiconductor wafer 10. A prior art contact hole 22 is formed on an IMD 18 of a semiconductor wafer 10. The IMD 18 comprises a barrier layer 12, a dielectric layer with a low k (dielectric constant) 14, and a cap layer 16. The barrier layer 12 is made of SiN, SiON, or SiC, the dielectric layer with a low k 14 is made of fluorine-rich silicate glass, and the cap layer 16 is made of SiO, SiN, SiON or SiC. The dielectric constant (k) of the dielectric layer with a low k 14 is less than the dielectric constant of the barrier layer 12 and the cap layer 16.

The prior art method of forming the contact hole 22 in the IMD 18 comprises coating a photo-resist layer on the IMD 18, and performing a lithography and an etching processes to remove the IMD 18 whetein the IMD 18 not covered by the photo-resist layer is removed to a predetermined thickness. That means to remove the cap layer 16, the dielectric layer with a low k 14 and the barrier layer 12 to form the contact hole 22. Then, a cleaning process is performed to completely remove the photo-resist layer. The formation of the metallic wire by filling the contact hole 22 with metallic materials is then followed.

In the cleaning process according to the prior art, first a dry ashing process is performed by injecting oxygen as reactive gases of the plasma chemical reaction to remove most of the photo-resist layer. Next, organic or inorganic solution is utilized for damaging the structure of the photo-resist layer to completely remove the remaining photo-resist layer. During the dry ashing process, oxygen plasma reacts with the dielectric layer with a low k 14 to form a bowl-shape contact hole 22, as shown in FIG. 1. The metallic materials can not completely fill the bowl-shape contact hole 22. Consequently, the metallic wire with voids insides is formed, which affect the electric performance of the semiconductor wafer 10. Besides, the dielectric constant of the dielectric layer with a low k 14 will be changed by oxygen plasma, so that the insulation of electric signal of the IMD 18 will be reduced.

SUMMARY OF THE INVENTION

It is therefore a primary objective of the present invention to provide a method of removing a photoresist layer from a semiconductor wafer to solve the above mentioned problems.

In a preferred embodiment, the present invention relates to a method of removing a photo-resist layer from a semiconductor wafer, the semiconductor wafer comprising an inter-metal dielectric layer, and a photo-resist layer positioned on the inter-metal dielectric layer, the method comprising:

performing a dry cleaning process by injecting a nitrogen-containing gas into an oxygen-free environment and utilizing a plasma reaction to remove most of the photo-resist layer; and performing a wet cleaning process to completely remove the photo-resist layer.

It is an advantage of the present invention that the cleaning process can avoid the contact hole being etched to form a blow-shape hole and the dielectric constant of the dielectric layer with a low k being changed.

These and other objective of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
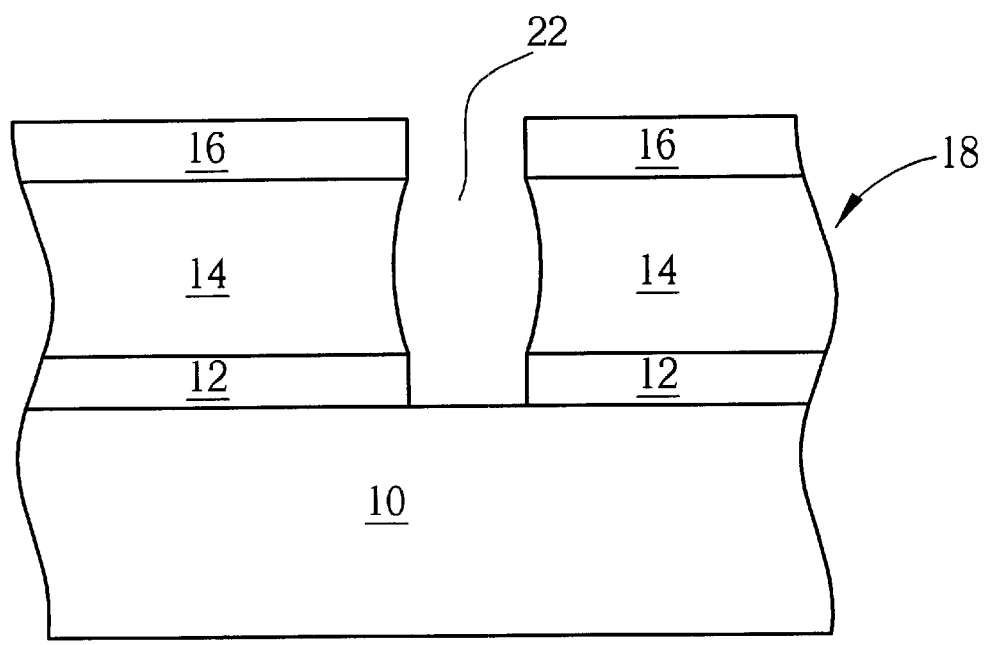
FIG. 1 is a schematic diagram of prior art method of forming a contact hole on a semiconductor wafer.
Figure 2:
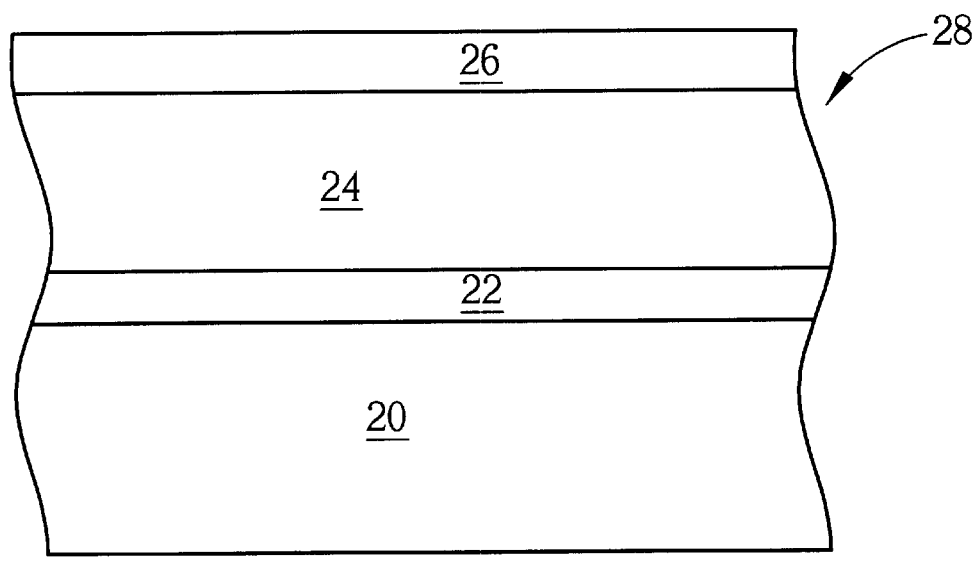
FIG. 2 to FIG. 4 are schematic diagrams of forming a contact hole on the semiconductor wafer according to the present invention.
Figure 3:
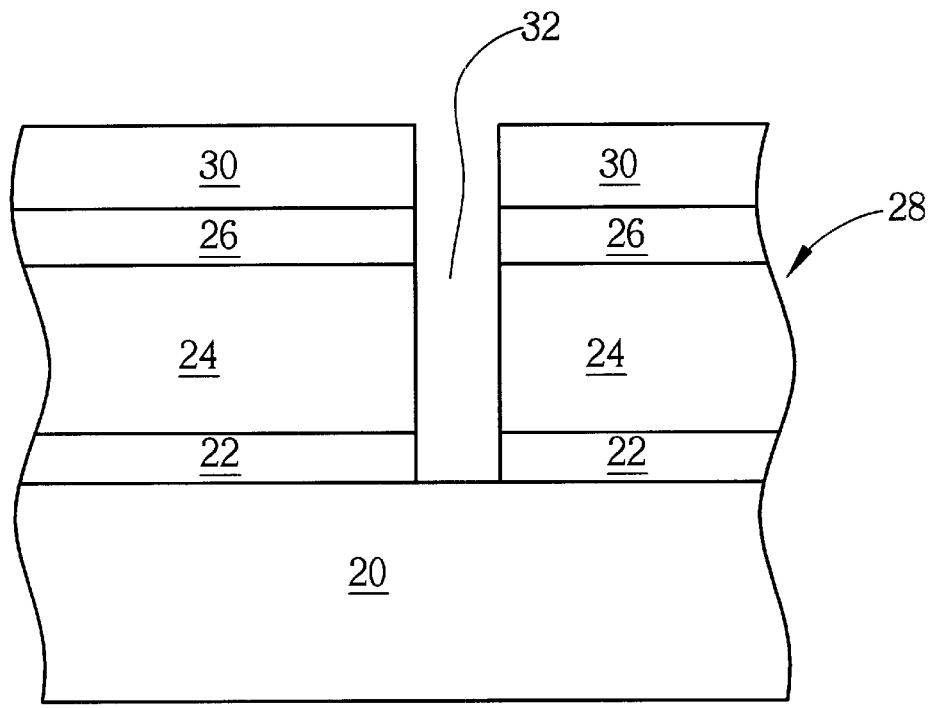
Figure 4:
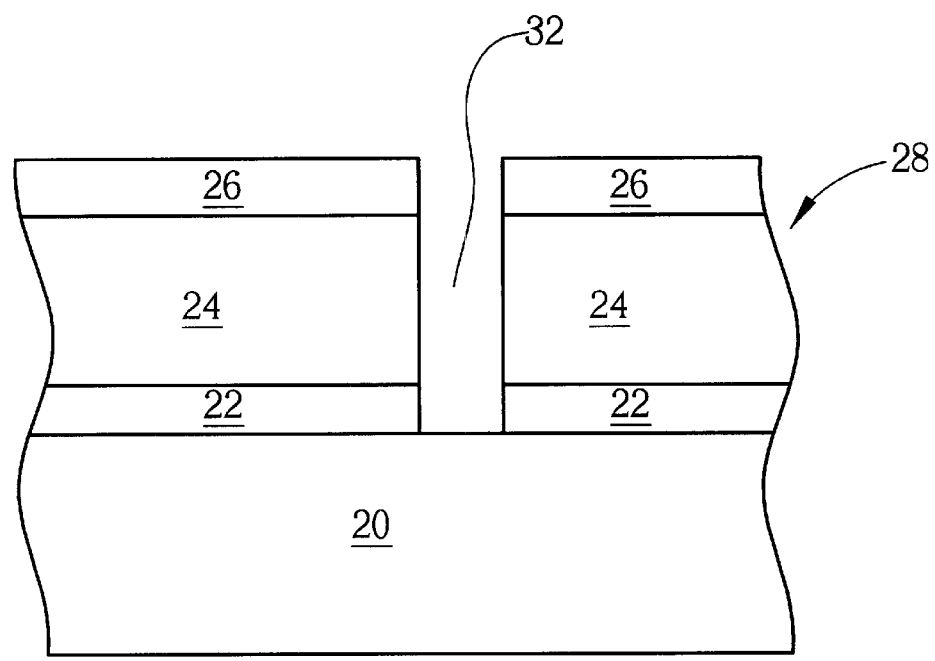

Please refer to FIG. 2 to FIG. 4. FIG. 2 to FIG. 4 are schematic diagrams of forming a contact hole 32 on a semiconductor wafer 20 according to the present invention. The present invention provides a method of removing the photo-resist layer, which can be applied in the dual-damascene process to remove the photoresist layer after the contact hole 32 is formed. The method of forming the contact hole 32 comprises forming a barrier layer 22, a dielectric layer with a low k (dielectric constant) 24 and a cap layer 26 on a semiconductor wafer 20. These three layers combined form an IMD 28, as shown in FIG. 2. The barrier layer 22 is made of SiN, SiON, or SiC, the dielectric layer with a low k 24 is made of fluorine-rich silicate glass, and the cap layer 26 is made of SiO, SiN, SiON or SiC. The dielectric constant of the dielectric layer with a low k 24 is less than the dielectric constant of the barrier layer 22 and the cap layer 26.

Next, performing a photolithography process, a photo-resist layer is coated on the semiconductor wafer 20 and a lithography and an etching processes are performed to remove the IMD 28 not covered by the photo-resist layer 30. The IMD 28 not covered by the photo-resist layer 30 is removed to a predetermined thickness. So the contact hole 32 is formed by removing the cap layer 26, the dielectric layer with a low k 24 and the barrier layer 22, as shown in FIG. 3. Finally, a cleaning process is performed to completely remove the photo-resist layer 30, as shown in FIG. 4.

In the present invention, the first step of removing the photo-resist layer 30 is to perform a dry cleaning process. A nitrogen-containing gas like $N_2$ or $NH_3$ is injected into an oxygen-free environment, and $H_2$ or Ar is also used as reactive gases to remove most of the photo-resist layer by plasma chemical reaction. The next step of removing the photo-resist layer 30 is to perform a wet cleaning process.

The ACT-970 solution produced by Advanced Chemical Technology company or the solution produced by EKC company is used as a cleaning solution to completely remove the photo-resist layer.

The present invention is performed in the oxygen-free environment, and the reactive gas is the nitrogen-containing gas. Since the reactive gas will not react with the dielectric layer with a low k 24, the contact hole 32 can still maintain its profile after removing the photo-resist layer 30. Therefore, the metallic materials can fill in the entire contact hole 32 to form a metallic wire without voids. The dielectric layer with a low k 24 will not be affected by the oxygen plasma chemical reaction, so the insulation of the IMD 28 can be insured. Utilizing the microscope to observe the semiconductor wafer 20 after performing the present invention, it was found that the remaining photo-resist layer 30 could be completely removed while the profile of the contact hole 32 could be kept well.

In contrast to the prior art method, the method of removing the photo-resist layer 30 according to the present invention is to inject the nitrogen-containing gas into an oxygen-free environment to remove most of the photo-resist layer 30 by plasma chemical reaction. Then, the wet cleaning process is performed to completely remove the photo-resist layer 30. Since the reactive gas will not react with the dielectric layer with a low k 24, the method in the present invention can insure the profile of the contact hole 32 and the dielectric constant of the dielectric layer with a low k 24.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of removing a photo-resist layer from a semiconductor wafer, the semiconductor wafer comprising an inter-metal dielectric layer, and a photo-resist layer positioned on the inter-metal dielectric layer, the method comprising:

performing a dry cleaning process by injecting a nitrogen-containing gas into an oxygen-free environment and utilizing a plasma reaction to remove most of the photo-resist layer; and performing a wet cleaning process to completely remove the photo-resist layer.

2. The method of claim 1 wherein the nitrogen-containing gas is nitrogen ($N_2$) or $NH_3$.

3. The method of claim 1 wherein the dry cleaning process also uses $H_2$ or Ar as reactive gases.

4. The method of claim 1 wherein the inter-metal layer comprises a barrier layer, a dielectric layer with a low dielectric constant positioned on the barrier layer, and a cap layer positioned on the dielectric layer wherein the dielectric constant of the dielectric layer is smaller than the dielectric constant of the barrier layer and the cap layer.

5. The method of claim 4 wherein the barrier layer is made of SiN, SiON, or SiC.

6. The method of claim 4 wherein the cap layer is made of SiO, SiN, SiON or SiC.

7. The method of claim 4 wherein the dielectric layer with a low dielectric constant is made of fluorine-rich silicate glass.

8. The method of claim 1 wherein the solution used in the wet etching process is an etching solution.

9. The method of claim 1 wherein the photo-resist layer and the inter-metal layer are both positioned in a predetermined region on the semiconductor wafer, and the inter-metal layer surrounding the predetermined region is removed to a predetermined thickness.

\* \* \* \* \*